United States Patent
Fjelstad et al.

(10) Patent No.: US 6,329,607 B1
(45) Date of Patent: *Dec. 11, 2001

(54) MICROELECTRONIC LEAD STRUCTURES WITH DIELECTRIC LAYERS

(75) Inventors: Joseph Fjelstad, Sunnyvale; John W. Smith, Palo Alto, both of CA (US)

(73) Assignee: Tessera, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/715,571

(22) Filed: Sep. 18, 1996

Related U.S. Application Data

(60) Provisional application No. 60/003,927, filed on Sep. 18, 1995.

(51) Int. Cl.[7] ............................................ H01R 9/09
(52) U.S. Cl. .................. 174/261; 257/688; 257/700; 228/180.21; 439/60; 439/91
(58) Field of Search ............................. 174/253, 254, 174/260, 261, 52.4; 228/180.21; 439/66, 91; 257/688, 700, 748, 759

(56) References Cited

U.S. PATENT DOCUMENTS

| | | |
|---|---|---|
| 2,758,797 | 8/1956 | Miklau . |
| 3,331,125 | 7/1967 | McCusker . |
| 3,374,537 | 3/1968 | Doelp, Jr. . |
| 3,460,105 | 8/1969 | Birt et al. . |
| 3,517,438 | 6/1970 | Johnson et al. . |
| 3,628,105 | 12/1971 | Kodaira-shi et al. . |
| 3,684,818 | 8/1972 | Netherwood . |
| 3,822,465 | 7/1974 | Frankort et al. . |

(List continued on next page.)

FOREIGN PATENT DOCUMENTS

| | | | |
|---|---|---|---|
| 0433997A2 | 12/1990 | (EP) . | |
| 0421343 A2 | 4/1991 | (EP) . | |
| 0489177 A1 | 6/1992 | (EP) . | |
| 1-95539 | * 4/1989 | (JP) | ................................ 228/180.21 |
| 1095539 | 4/1989 | (JP) . | |
| 4155935 | 5/1992 | (JP) . | |
| 4162543 | 6/1992 | (JP) . | |
| 4245450 | 9/1992 | (JP) . | |
| 4287939 | 10/1992 | (JP) . | |
| WO 92/05582 | 4/1992 | (WO) . | |
| WO 94/03036 | 2/1994 | (WO) . | |

OTHER PUBLICATIONS

Paul D. Franzon, Electrical Design of Digital Multichip Modules, *Multichip Module Technologies and Alternatives—The Basics*, chapter 11, Doane and Franzon, eds, 1993, pp. 525–568.

*Thin Film Module*; 700 IBM Technical Disclosure Bulletin, Jan. 31, 1989, No. 8, Armonk, NY, US; pp. 135–138.

Recent Advances in Single Point Tab Bonding Tools, by Jerry Carlson Microminiature Technology, Inc.

Electrical Characterization of the Interconnected Mesh Power System (IMPS) MCM Topology by Schaper, et al., 1994 IEEE, pp. 791–795.

*Primary Examiner*—Albert W. Paladini
(74) *Attorney, Agent, or Firm*—Lerner, David, Littenberg, Krumholz & Mentlik, LLP

(57) ABSTRACT

A microelectronic connection component has flexible leads formed by polymeric strips with metallic conductors thereon. The metallic conductors may be very thin, desirably less than 5 microns thick, and provide good fatigue resistance. Each strip may have two conductors thereon, one serving as a principal or signal conductor for connection to a contact on a chip or other microelectronic element and the other serving as potential reference or ground conductor. The potential reference conductor on the lead provides enhanced resistance to crosstalk.

36 Claims, 9 Drawing Sheets

U.S. PATENT DOCUMENTS

| | | |
|---|---|---|
| 4,030,657 | 6/1977 | Scheffer . |
| 4,069,961 | 1/1978 | Nicklaus et al. . |
| 4,141,712 | 2/1979 | Rogers . |
| 4,234,666 | 11/1980 | Gursky . |
| 4,312,926 | 1/1982 | Burns . |
| 4,320,572 | 3/1982 | Brower et al. . |
| 4,323,914 | 4/1982 | Berndlmaier et al. . |
| 4,331,740 | 5/1982 | Burns ................................... 428/572 |
| 4,380,042 | 4/1983 | Angelucci, Jr. et al. ............ 361/813 |
| 4,413,404 | 11/1983 | Burns . |
| 4,435,741 | 3/1984 | Shimizu et al. . |
| 4,616,412 | 10/1986 | Schroeder . |
| 4,633,583 | 1/1987 | Kato . |
| 4,756,080 | 7/1988 | Thorp, Jr. et al. . |
| 4,776,509 | 10/1988 | Pitts et al. . |
| 4,812,421 | 3/1989 | Jung et al. . |
| 4,859,806 | 8/1989 | Smith . |
| 4,887,758 | 12/1989 | Suzuki et al. . |
| 4,891,104 | 1/1990 | Simpson et al. . |
| 4,912,547 | 3/1990 | Bilowith et al. ...................... 257/758 |
| 4,931,134 | 6/1990 | Hatkevitz et al. . |
| 4,949,453 | 8/1990 | Neumann et al. . |
| 4,989,069 | 1/1991 | Hawkins . |
| 5,007,576 | 4/1991 | Congleton et al. . |
| 5,042,147 | 8/1991 | Tashiro . |
| 5,057,461 | 10/1991 | Fritz . |
| 5,059,559 | 10/1991 | Takahashi et al. . |
| 5,065,504 | 11/1991 | Olla . |
| 5,065,506 | 11/1991 | Kiribayashi . |
| 5,075,760 | 12/1991 | Nakashima et al. ................. 257/668 |
| 5,127,570 | 7/1992 | Steitz et al. . |
| 5,130,783 | 7/1992 | McLellan ............................. 257/727 |
| 5,148,265 | 9/1992 | Khandros et al. . |
| 5,148,266 | 9/1992 | Khandros et al. . |
| 5,148,967 | 9/1992 | Gabaldon et al. . |
| 5,156,318 | 10/1992 | Suzuki et al. . |
| 5,162,896 | 11/1992 | Takubo et al. . |
| 5,173,574 | 12/1992 | Kraus . |
| 5,177,863 | 1/1993 | Lam ....................................... 29/830 |
| 5,189,363 | 2/1993 | Bregman et al. .................... 324/754 |
| 5,193,732 | 3/1993 | Interrante et al. . |
| 5,217,154 | 6/1993 | Elwood et al. . |
| 5,225,633 | 7/1993 | Wigginton . |
| 5,252,784 | 10/1993 | Asai et al. . |
| 5,331,203 | 7/1994 | Wojnarowski et al. ............... 257/698 |
| 5,367,763 | 11/1994 | Lam . |
| 5,390,844 | 2/1995 | DiStefano et al. .............. 228/180.21 |
| 5,394,009 | 2/1995 | Loo . |
| 5,398,863 | 3/1995 | Grube et al. ......................... 228/106 |
| 5,408,052 | 4/1995 | Inaba et al. . |
| 5,452,182 | 9/1995 | Eichelberger et al. . |
| 5,477,611 | 12/1995 | Sweis et al. . |
| 5,489,749 | 2/1996 | DiStefano et al. .................... 174/261 |
| 5,491,302 | 2/1996 | DeStefano et al. ................... 174/260 |
| 5,518,964 | 5/1996 | DiStefano et al. .................... 438/113 |
| 5,536,909 | 7/1996 | DiStefano et al. .................... 174/261 |
| 5,548,091 | 8/1996 | DiStefano et al. . |
| 5,550,406 | 8/1996 | McCormick ......................... 257/666 |
| 5,552,631 | 9/1996 | McCormick . |
| 5,619,017 | 4/1997 | DiStefano et al. . |
| 5,629,239 | 5/1997 | DiStefano et al. . |
| 5,638,596 | 6/1997 | McCormick . |
| 5,706,174 | 1/1998 | DiStefano et al. . |
| 5,798,571 | 8/1998 | Nakajima . |

* cited by examiner

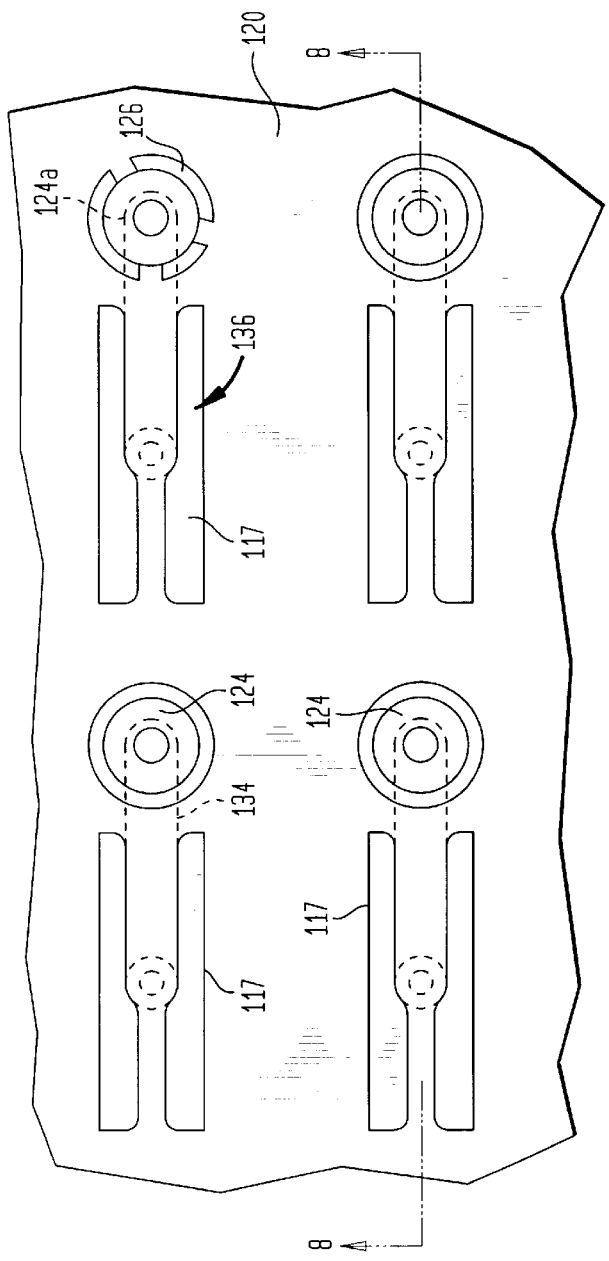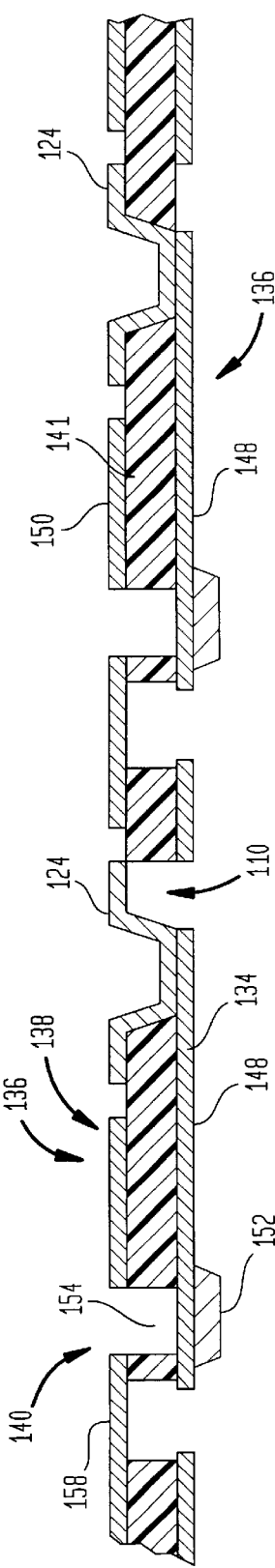
FIG. 7
FIG. 8

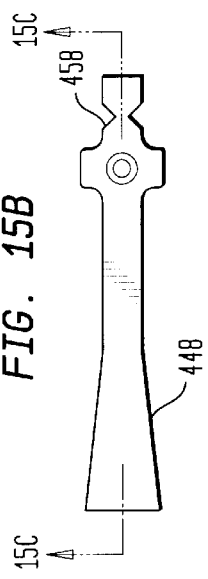
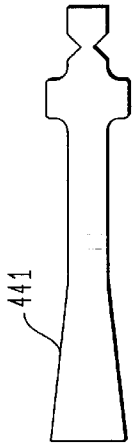
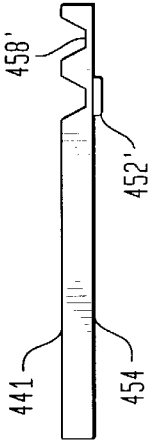
FIG. 15A  FIG. 15B  FIG. 15C  FIG. 15D
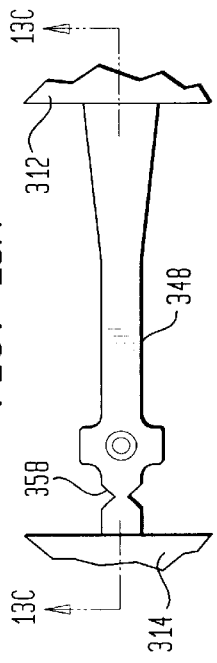
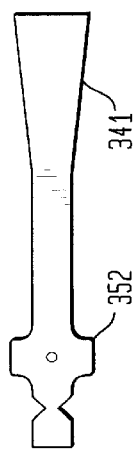
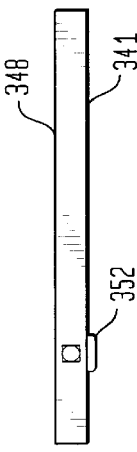
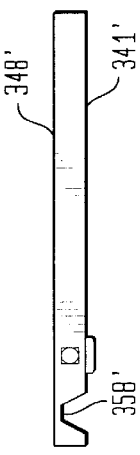
FIG. 13A  FIG. 13B  FIG. 13C  FIG. 13D

MICROELECTRONIC LEAD STRUCTURES WITH DIELECTRIC LAYERS

CROSS REFERENCE TO RELATED APPLICATIONS

The present application claims benefit of U.S. Provisional Application No. 60/003,927 filed Sep. 18, 1995, the disclosure of which is incorporated by reference herein.

FIELD OF THE INVENTION

The present invention relates to components and methods used in mounting and connecting microelectronic elements such as semiconductor chips.

BACKGROUND OF THE INVENTION

Semiconductor chips and other microelectronic elements typically have contacts which must be connected to external circuitry, such as the circuitry of a supporting substrate or circuit panel. Various processes and components for making these connections have been provided heretofore. For example, in a wire bonded assembly the chip is physically mounted on a substrate and individual fine wires are connected between the contacts of the chips and contact pads on the substrate. In tape automated bonding or "TAB" processes, a dielectric supporting tape such as a thin foil of a polymer is provided with a hole slightly larger than the chip. An array of metallic leads is provided on one surface of the dielectric tape. These leads extend inwardly from around the hole so that an inner end of each lead projects inwardly beyond the edge of the hole. These ends are arranged side by side at spacings corresponding to the spacings of the contacts on the chip. The inner ends of the leads are bonded to the contacts on the chip, whereas outer ends of the leads are attached to contact pads on the substrate. In the "beam lead" process, the chip is provided with leads extending from contacts on the chip outwardly beyond the edges of the chip. The chip is positioned on the substrate so that the outer ends of the leads lie over the appropriate contact pads of the substrate and the leads are bonded to the contact pads.

The rapid evolution of the semiconductor art has created a need for progressively greater numbers of contacts and leads in a given amount of space. An individual chip may require hundreds or even thousands of contacts and leads. For example, a complex semiconductor chip in current practice may have rows of contacts spaced apart from one another at center to center distances of 0.5 mm or less. These distances are decreasing progressively with continued progress in the semiconductor art. With such closely spaced contacts, the leads connected to the chip contacts such as the wires in wire bonding and the leads used in the TAB and beam lead processes must be extremely fine structures, typically less than 0.1 mm wide. These fine structures are susceptible to damage and deformation during manufacture. Even minor deviation of a lead from its intended position during the bonding process can result in defects in the final assembly.

As disclosed, for example, in U.S. Pat. Nos. 5,489,749 and 5,536,909 and in PCT Published International Application WO 94/03036, published 3 February 1994, all of which are incorporated by reference herein, a component for mounting a semiconductor chip may include a support structure such as a polymeric film defining one or more gaps and one or more leads extending across such gap. The supporting structure typically has terminals on it. Each lead has a connection section with a first end permanently secured to the supporting structure on one side of the gap and a second end remote from the first end. The first ends of the lead connection sections typically are connected to the terminals. The second end of each connection section may be releasably secured to the opposite side of the gap. For example, each lead may include a frangible section connecting the second end of the connection section to the support structure. Thus, each lead bridges across the gap in the support structure. The leads are maintained in the proper position and orientation so that when the connection component is juxtaposed with the chip, each lead is at or near the desired position relative to the associated contact on the chip. Each lead is then engaged by a bonding tool which enters the gap and forces each lead downwardly into engagement with the appropriate contact of the chip. Preferably, each lead is guided by the bonding tool during this operation. Because each lead is supported at both ends, the leads remain in position before the bonding process. When the leads are bonded to the contacts of the chip, the terminals on the supporting structure are electrically connected to the chip. Thus, the chip can be connected to external circuitry by attaching the terminals on the supporting structure to a larger substrate, as by solder bonding the terminals to the larger substrate. The bonded leads typically provide flexible interconnections between the contacts of the chip and the terminals and thus allow compensation for thermal expansion and contraction of the chip and substrate. Components and bonding methods as disclosed in the '749 and '909 patents and in the '036 International Publication provide rugged, compact and economical chip mountings, and offer numerous advantages. Still further improvements and enhancements to such chip mountings are disclosed in U.S. Pat. No. 5,398,863 and U.S. Pat. No. 5,491,302, the disclosures of which are hereby also incorporated by reference herein. Bonding tools useful in attaching leads according to the '794 patent and '036 publication and for other purposes are disclosed in U.S. Pat. No. 5,390,844, the disclosure of which is also incorporated by reference herein.

The connection sections of leads made in accordance with the aforementioned patents and publication most typically are made from metals such as copper, gold, platinum, nickel, aluminum, silver and alloys of these metals. Combinations of multiple metal layers may also be employed. The '749 and '909 patents also disclose the use of polymeric strips, such as polymeric strips formed integrally with the support structure, in the leads. Thus, the polymeric strips serve as part of the lead structure, along with one or metal layers. In certain embodiments disclosed in these patents, the frangible sections are formed by interrupting the metal layers. In these embodiments, the polymeric layer extends across the frangible section, so that the polymeric layer breaks when the end of the connection section is displaced downwardly into engagement with the chip. As further disclosed in these patents, the polymeric strips can be employed in cantilevered leads, i.e., in leads which are not supported at both ends prior to bonding in accordance with the preferred embodiments of the patents. Still other structures taught in these patents provide the polymeric strip as a reinforcement only adjacent the first end of the lead connection section, i.e., only where the lead joins the support structure, so as to alleviate stress concentration at this point. The remainder of the lead is composed only of the metal layers.

Other lead structures are disclosed in U.S. Pat. No. 5,518,964, the disclosure of which is also incorporated by reference herein. As shown in certain embodiments of the '964 patent, a microelectronic connection component may include a dielectric sheet having an array of elongated, striplike leads. Each lead may have a terminal end permanently fastened to the sheet and a tip end detachably connected to the sheet. In use, the sheet can be juxtaposed with a microelectronic element such as a chip or an entire wafer. The tip ends of the leads are bonded to the contacts on the chip while the tip ends remain attached to the sheet. After bonding, the sheet and the microelectronic element are moved away from one another, thereby detaching the tip ends from the sheet and bending the leads away from the sheet. This leaves the leads in a vertically extensive, flexible configuration.

Despite these improvements, still further improvements would be desirable. Thus, improvements in the structure of polymer reinforced leads to facilitate fabrication of such leads and to facilitate the bonding process would be desirable.

It also would be desirable to provide lead designs which offer even better resistance to the respected flexure encountered during operation, and which can provide good resistance to such failure even when formed with relatively brittle, fatigue-prone metals.

Moreover, the electrical characteristics of interconnecting elements can affect the performance of the microelectronic circuit as a whole. As described, for example, in Electrical Design of Digital Multichip Modules, by Paul D. Franzon, chapter 11 in the treatise Multichip Module Technologies and Alternatives—The Basics, Doane and Franzon, eds, 1993, pp. 525–568, the electrical characteristics of interconnecting elements can influence the speed of operation of the circuit. Although a full treatment of the electrical design of microelectronic circuitry is beyond the scope of this disclosure, the quality of signal transmission, and the time required for signal propagation from one microelectronic element to another will depend upon factors such as the lengths and the characteristic impedances of the transmission lines constituting the connection and the like. Conductors extending within the interiors of circuit panels commonly are provided as "striplines." In a stripline, the conductor carrying the signal is juxtaposed with a voltage reference plane such as power plane or a ground plane. A dielectric layer typically is provided between the conductor and the reference plane.

However, the leads which extend from circuit panels to the chip contacts typically have not been provided as striplines heretofore. Thus, in the wire bonding, TAB and beam lead processes, the leads are single conductors, without any voltage reference plane in proximity to the conductor. The leads thus have electrical properties such as characteristic impedances markedly different from the striplines of the circuit panels. Moreover, leads utilized in the aforementioned structures are susceptible to "crosstalk." Signals propagating on one lead can induce spurious signals on adjacent leads and on the connected elements of the circuit. The problem of crosstalk is aggravated by close physical spacing of the leads and further aggravated as the operating speeds of the circuit elements increase. It would be desirable to provide microelectronic connection components and methods which offer better control of electrical characteristics in the leads and better resistance to crosstalk. It would be particularly desirable to provide such leads in a compact and economical structure which is compatible with closely-spaced contacts on the microelectronic element.

SUMMARY OF THE INVENTION

The present invention addresses these needs.

One aspect of the present invention provides a microelectronic connection component including a dielectric support structure and a plurality of flexible leads attached to the support structure. Each lead includes a flexible dielectric member, a principal conductor and a reference conductor extending codirectionally with the principal conductor along the dielectric member. Preferably, each flexible dielectric member is a dielectric strip having top and bottom surfaces. The principal conductor of each lead overlies either the top or the bottom surface of the strip and the reference conductor overlies the opposite surface of the strip. The support structure desirably is a flat, sheetlike element having top and bottom surfaces continuous with the top and bottom surfaces of the strips. Terminals may be disposed on one or more surfaces of the support structure and the principal conductors of the leads may be connected to the terminals. The strips and the support structure may be formed integrally with one another and may have either the same thickness of different thicknesses. Most preferably, the support structure and strips are formed as parts of a common dielectric sheet. The component preferably includes a conductive first potential reference element or potential plane overlying a surface of the support structure. The reference conductors of at least some of the leads are electrically connected to the first potential reference element.

In one arrangement, the first potential reference element overlies the top surface of the support structure and the first potential reference element has holes in it. The terminals are disposed on the top surface of the substrate in the holes. At least some of the terminals are electrically isolated from the first potential reference element. The reference conductors of the leads overlie the top surfaces of the strips and are continuous with the first potential reference element whereas the principal conductors of the leads are disposed on the bottom surfaces of the strips. The component may include electrically conductive vias extending from at least some of the terminals to the bottom surface of the support structure, the principal conductors of at least some of the leads being connected to the vias, as by electrically conductive traces extending along the bottom surface of the support structure.

In components according to this aspect of the invention, the reference conductor, principal conductor and dielectric, form paired conductors extending along the flexible leads. Each such paired conductor may be continuous with further striplines or paired conductors defined by the traces and the first potential reference element. The paired conductor leads are substantially immune to crosstalk. The leads connections are adapted to be bonded to contacts on chips or other microelectronic elements.

A further aspect of the invention includes an assembly including a component as discussed above together with a microelectronic component having a front surface facing the bottom surfaces of the support structure and the strips, the microelectronic element having contacts on its front surface. The principal conductors of the leads are connected to the contacts on the microelectronic element, and the reference conductors of the leads extend to the vicinity to the contacts.

Yet another aspect of the present invention provides a connection component including a support structure and one or more flexible leads. Each lead includes a connection section having a first end attached to the support structure and the second end remote from the first end. Each such lead includes a flexible dielectric strip extending between the first and second ends, the strip having oppositely directed top and bottom surfaces. Each such lead also includes a first conductor or conductive layer overlying one of the surfaces of the strip. The first conductor is less than ten microns thick, more preferably less than about 5 microns thick and most preferably between about 2 microns and about 5 microns thick. The component according to this aspect of the invention may further include a second conductor overlying the other surface of the flexible dielectric strip. The second conductor may have the same thickness as discussed above with reference to the first conductor. The first and second conductors desirably are metallic. The dielectric strip desirably is a flexible polymeric strip between about 10 microns and about 50 microns thick. According to this aspect of the invention, the flexible dielectric strip provides a significant portion, and desirably the majority, of the structural strength of the lead connection section. Thus, the conductive layers serve principally to provide electrical conductivity. This aspect of the invention incorporates the realization that very thin layers, less than 10 microns and desirably less than about 5 microns thick can provide excellent flex fatigue resistance, even where the conductive layers are formed from materials such as metals commonly regarded as brittle or lacking in flex fatigue resistance. Thus, metallic conductive layers can be formed from low cost metals such as copper and copper based alloys. The metallic layers may include plural smaller layers or coatings of other metals such as gold or may be formed entirely from metals such as gold. Even where relatively costly metals such as gold are employed, the amounts of gold required to form such thin layers are minimal. Moreover, with such thin conductive layers, the processing times required for plating or etching the layers are markedly reduced.

Most preferably, the second end of the connection section in each lead is releasably attached to the support structure. For example, the second end of each lead may be attached to the support structure by means of a frangible section in the lead. Leads according to this aspect of the present invention provide advantages similar to those discussed above with reference to the '749 and '909 patents. A particularly preferred connection component according to this aspect of the present invention has the flexible polymeric layer extending from the first end of the connection section to the second end of the connection section, but not extending across the frangible section. Thus, the frangible section is devoid of the polymeric layer but includes one or more of the metallic layers. Particularly where very thin metallic layers as discussed above are employed, the metallic layer can be readily broken and provides a reliable frangible connection.

According to yet another variant of the present invention, the leads with polymeric layers as aforesaid can be incorporated in structures as described in the '964 patent and can be used in processes of bonding and deforming as discussed in such patent.

Further aspects of the present invention provide connection components with leads adapted to facilitate bonding. Thus, each lead includes a connection section as aforesaid having a first end attached to the support structure and having a second end remote from the first end. Here again, each connection section includes a polymeric strip with oppositely directed top and bottom surfaces and a first metallic layer overlying one of these surfaces. The connection components according to this aspect of the present invention have metallic projections extending downwardly from the metallic layers of the leads and protruding downwardly from the remainder of the lead in a bond region adjacent the second end of the connection section. The metallic projection aids in concentrating sonic or ultrasonic energy applied through the lead. Where the first metallic layer is disposed on the top surface of the polymeric strip, the projection may extend through the strip. Alternatively, the layer forming the principal conductor for bonding to the contact on the chip or other microelectronic element may be positioned on the bottom surface of the strip. In this case, the dielectric strip desirably has a hole in it in the bond region. As further discussed below, a bonding tool can be engaged in the hole so that energy can be coupled directly from the tool to the metallic layer on the bottom surface, without the need to transmit the energy through the intervening polymeric layer. Moreover, the hole can provide firm interengagement between the tool and the lead and thus can allow the tool to guide the lead during the bonding process.

Still further aspects of the present invention provide methods of bonding connection components as aforesaid and methods of making microelectronic components as aforesaid.

BRIEF DESCRIPTION OF THE DRAWINGS

FIG. 7 is a fragmentary top view depicting a portion of a component in accordance with a further embodiment of the invention.

FIG. 8 is a sectional view taken along line 8—8 in FIG. 7.

FIGS. 13A and 13B are fragmentary, diagrammatic top and bottom views depicting portions of a component in accordance with yet another embodiment of the invention.

FIG. 13C is a sectional view taken along line 13C in FIG. 13A.

FIG. 13D is a view similar to FIG. 13C but depicting a component in accordance with another embodiment of the invention.

FIGS.. 15A and 15B are fragmentary, diagrammatic bottom and top views, respectively, of a component in accordance with yet another embodiment of the invention.

FIG. 15C is a sectional view taken along line 15C in FIG. 15B.

FIG. 15D is a view similar to FIG. 15C but depicting a component in accordance with yet another embodiment of the invention.

DETAILED DESCRIPTION OF THE PREFERRED EMBODIMENTS

Figure 1:
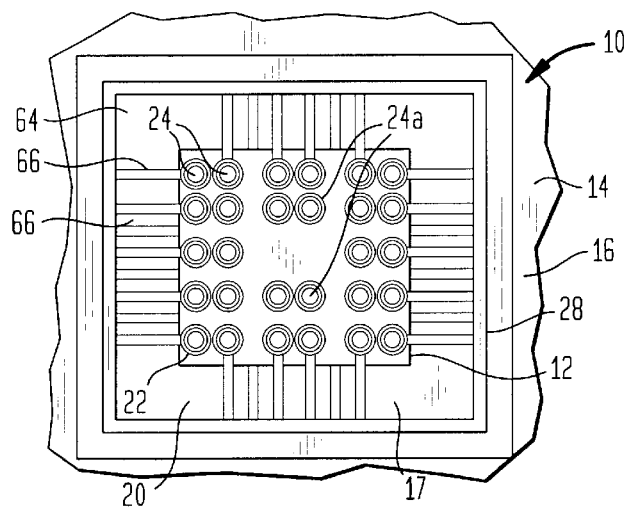
FIG. 1 is a diagrammatic top view of a component in accordance with one embodiment of the invention, taken in conjunction with a semiconductor chip.
Figure 2:
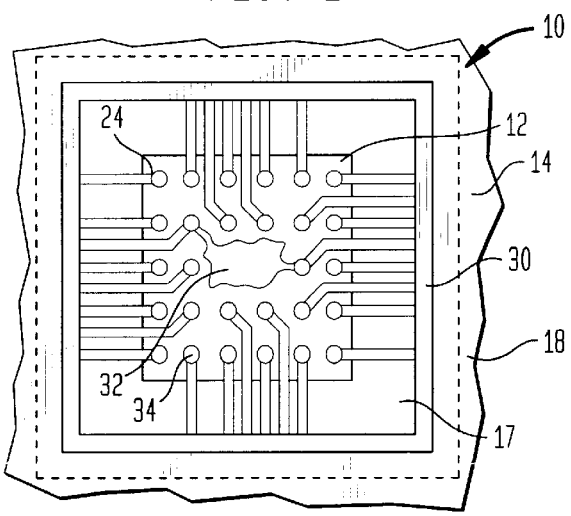
FIG. 2 is a diagrammatic bottom view of the component depicted in FIG. 1.
Figure 6:
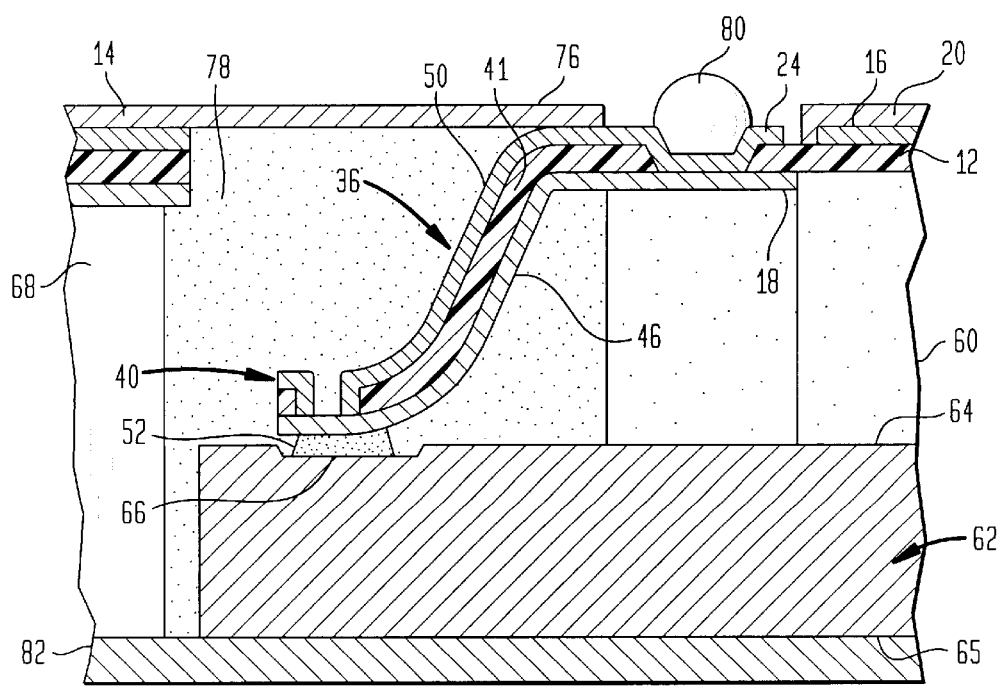
FIG. 6 is a fragmentary, diagrammatic sectional view taken along line 6—6 in FIG. 5, but depicting the assembly at a later stage of manufacture

A connection component in accordance with one embodiment of the invention includes a polymeric film support structure 10 having a central region 12, a peripheral region 14 and a series of slots 17 separating the central region from the peripheral region. Slots 17 are united with one another to form a ring-like, annular channel surrounding the central region. The support structure or film 10 may be formed from a flexible, sheetlike dielectric material such as the material sold under the trademark KAPTON E by the DuPont Chemical Corporation, polyimide, preferably between about 10 microns and about 50 microns thick and more preferably between about 10 microns and about 25 microns thick. Film 10 has a top surface 16 visible in FIG. 1 and a bottom surface 18 visible in FIG. 2. In the central region 12, top surface 16 is substantially covered by a first potential reference plane 20 in the form of a thin, metallic conductive layer. Layer 20 can be used as a ground plane as discussed below. Layer 20 has numerous holes 22 formed therein. A plurality of metallic via liners 24 extend through holes 22 and through the support structure or dielectric film to the bottom surface 18 in central region 12. Each such via liner 24 provides an exposed terminal on the top surface 16 of the supporting structure. Most of the via liners 24 are electrically isolated from layer 20, and do not contact the layer. A few via liners 24a are electrically connected to layer 20 by small flexible metallic bridges 26 extending inwardly from the edge of the hole 20 to the via liner 24a, as best seen in FIG. 6. A metallic bus 28 extends around peripheral region 14, parallel to the outer edges of slots 17 on the top surface 16 of the support structure. A similar bus 30 extends around the peripheral region on the bottom surface 18 of the support structure.

A second potential reference element 32 is disposed on the bottom surface of the support structure in central region 12. The second potential reference element 32 may also be a thin layer of a metal. Potential reference element 32, however, only covers a relatively small portion of the central region. A plurality of metallic traces 34 extend along the bottom surface of the central region, from the bottom ends of the via liners 24 towards the edges of the central region and hence towards slots 17.

A plurality of leads 36 extend across slots 17. Each lead 36 has a connection section with a first end 38 attached to the central region 12 of the support structure and a second end 40 remote from the central region of the support structure and remote from first end 38. The connection section of each lead includes a dielectric strip 41 having a top surface 44 continuous with the top surface 16 of the support structure in central region 12 and a bottom surface 46 continuous with the bottom surface 18 of the support structure in the central region. Each lead further includes a principal conductor 48 in the form of a metallic strip overlying the bottom surface 46 of strip 40 and a potential reference conductor 50 overlying the top surface of strip 40. Conductors 48 and 50 are formed as thin metallic layers. Preferably, conductors 48 and 50 are less than about 10 microns thick, more preferably less than about 5 microns thick and most preferably between about 2 microns and about 5 microns thick. Each principal conductor 48 is continuous with a trace 34, so that each principal conductor is electrically connected to at least one of the via liners 24 and hence is electrically connected to at least one of the terminals defined by the via liners on the top surface. A few of the traces 34 are electrically connected to the second potential reference element 32, so that the particular principal conductors 48 attached to these traces are connected to several via liners. Thus, all of the traces, principal conductors 48 and via liners 24 which are connected to the second potential reference element 32 are electrically connected to one another. As further explained below, these elements serve as the power connections for the associated semiconductor chip. All of the potential reference conductors 50 of the various leads are continuous with the first potential reference element or ground plane 20.

Figure 3:
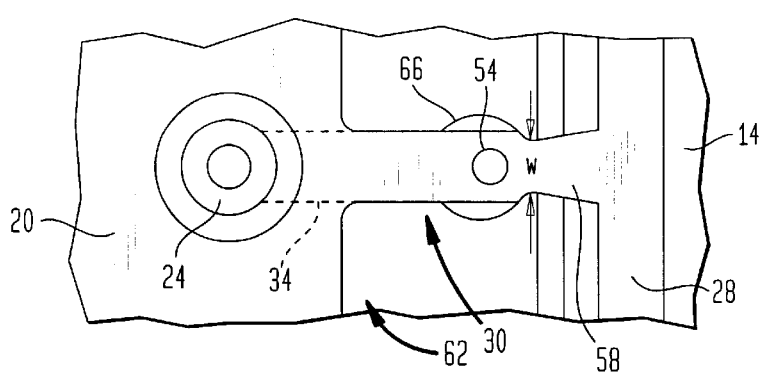
FIG. 3 is a fragmentary view on an enlarged scale depicting portions of the component illustrated in FIG. 1.

Each lead 36 has a projection 52 extending downwardly from the principal conductor or metallic layer 48 in a bond region of the connection section, adjacent the second end 40 thereof. Each lead also has a hole 54 extending downwardly into polymeric layer 41 in the bond region, in alignment with projection 52 and a hole in the potential reference conductor 50 aligned with hole 54, so that hole 54 is open to the top surface of the component. The metallic layer forming the potential reference conductor 50 on the top surface of each polymeric strip 41 is continuous with the bus 28 on the top surface of the peripheral region 14. However, the polymeric strips 41 and lower metal layers 48 are interrupted to provide gaps 56 in these layers between the second end 40 of the connection section and the polymeric layer of peripheral portion 14. This leaves the second end 40 of the securement section attached to the peripheral portion 14 only through a small portion 58 of the metallic layer on the top surface. As best seen in FIG. 3, the width W of this portion 58 is smaller than the width of adjacent portions of the metallic layer. Metallic layer portion 58 thus constitutes a frangible connection between the second end 40 of the connection section and the peripheral portion 14 of the support structure. A compliant dielectric pad 60, formed from a soft material such as a foam, gel or elastomer is disposed beneath the bottom surface 18 of the central portion.

Figure 4:
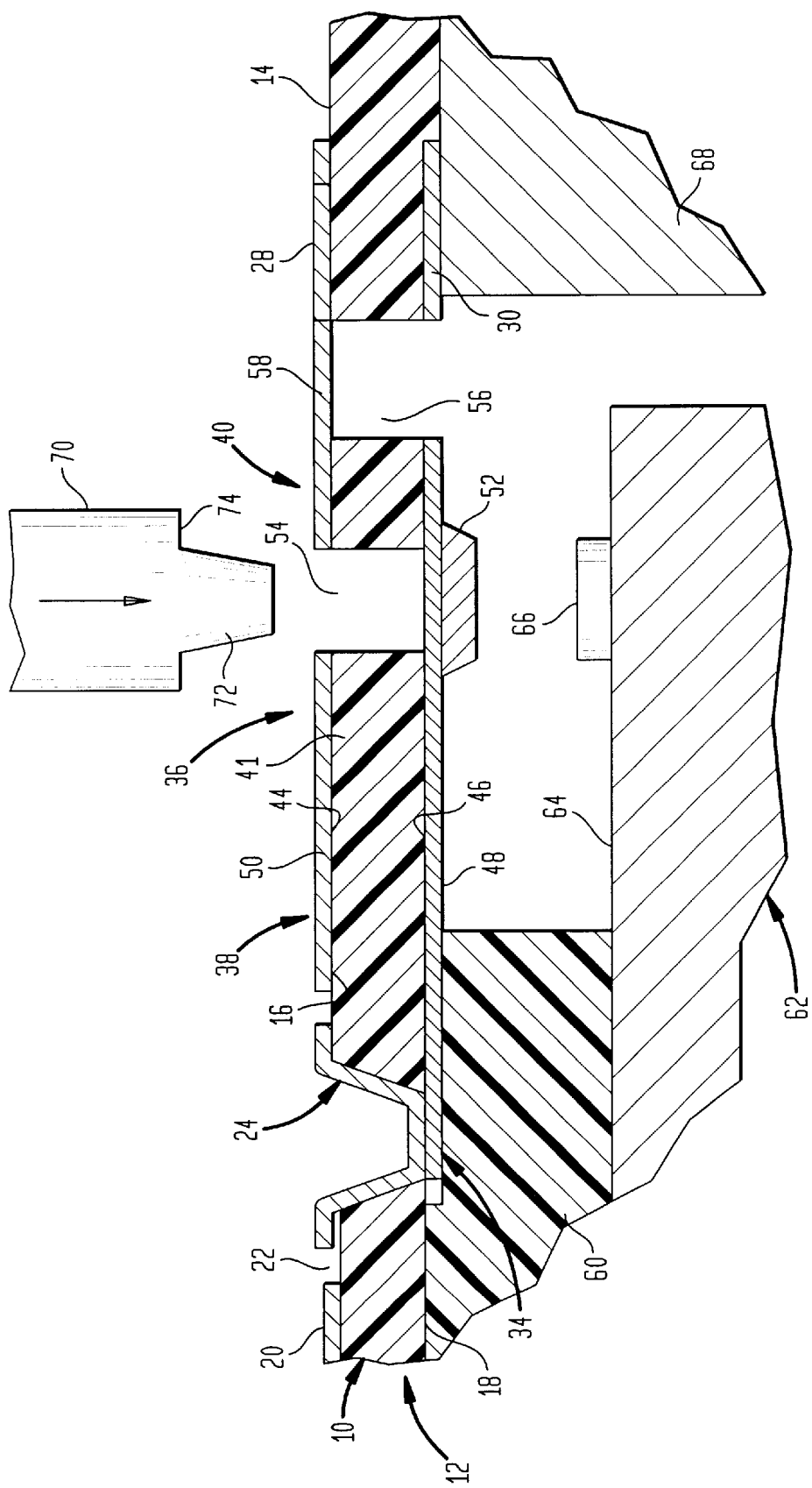
FIG. 4 is a fragmentary diagrammatic sectional view taken along line 4—4 in FIG. 3, showing the chip and component in conjunction with a bonding tool.
Figure 5:
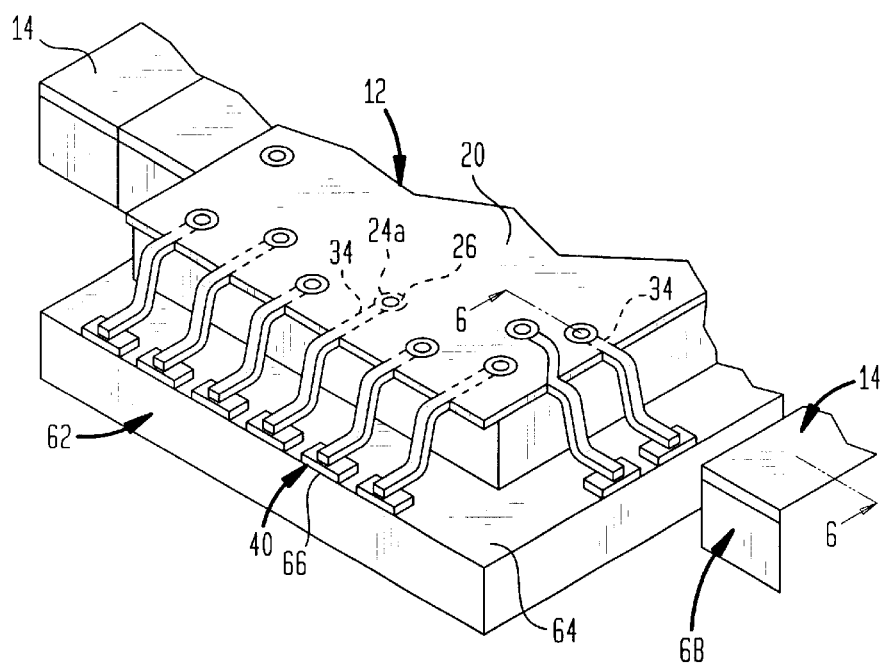
FIG. 5 is a fragmentary, diagrammatic sectional view depicting the assembly made from the chip and components of FIGS. 1–4.

In use, the connection component is assembled to a chip 62 having a front surface 64 with contacts 66 thereon. Contacts 66 are arranged in rows along the periphery of the chip. The connection component is aligned with the chip so that each row of contacts 66 extends along one of the slots 17. The connection sections 36 of the leads, and particularly, bond regions and projections 52 of the leads are aligned with the contacts 66. The central region 12 of the support structure overlies the center of the chip and is supported on the front face 64 of the chip through the compliant layer 60. A ring-like support 68 surrounds the periphery of the chip and supports the peripheral region 14 of the support structure. A bonding tool 70 is advanced downwardly from the top of the assembly into engagement with each lead 36. As best seen in FIG. 4, the bonding tool has a projection 72 at its bottom end. The projection is slightly longer than the combined thickness of the top metal layer or reference conductor 50 and dielectric strip 41, so that projection 72 bears on the top surface of the lower metal layer or principal conductor 48. A shoulder 78 on the tool may also bear on the top metal layer or reference conductor 50. As the tool travels downwardly, it forces the second end 40 of the connection section downwardly, thereby breaking the top metal layer in frangible section 58.

Continued motion of the tool forces the second end 40 of the connection section downwardly until the projection 52 engages a contact 66 on the chip. During its downward motion, the bonding tool 70 may move laterally so as to guide each lead into precise alignment with the appropriate contact 66. The bonding tool may be controlled by appropriate machine vision systems (not shown). The bonding tool preferably also moves longitudinally with respect to the lead in the direction towards the first end 38 of the lead, thereby forming the lead into a generally curved S-shaped configuration. These processes of lead alignment, bending and bonding are more fully described in the patents incorporated by reference herein. However, in the process using the lead of FIGS. 1–6, engagement between the bonding tool and the lead is effected by engagement of projection 72 in hole 54. This engagement allows the lead bonding tool to move the second end of the lead both laterally and longitudinally. When the lead has been engaged with the appropriate contact 66, projection 52 bears on the contact. Energy is applied through tool 70, as by applying heat and sonic or ultrasonic energy to bond projection 52 to contact 66. Because projection 72 bears directly on the metal of the lower metal layer or principal conductor 48, the energy is transmitted efficiently in metal to metal contact, without passing through the polymeric dielectric strip 41.

The resulting assembly has the central portion 12 of the support structure overlying the central portion of the chip front surface 64, and has the connection sections 50 of the various leads attached to terminal 66 on the chip. The principal conductor or lower metal layer 46 on the bottom surface of each polymeric strip is connected to a contact 66 of the chip. Thus each contact 66 of the chip is connected to a trace 34 on the bottom surface of central region 12 and to one of the via liners 24 thereby connecting each contact to a terminal on the top surface of the central region or chip carrier 12. As discussed above, a few of the traces 34 and hence a few of the principal conductors 46 and chip contacts 66 are connected in common to the second potential reference element 32 (FIG. 6) on the bottom surface of central region 12. These connected leads preferably are used as the power connection for the chip. Thus, the particular chip contacts so connected are the power input terminals of the chip. The potential reference conductors 50 and first potential reference element 20 are electrically isolated from most of the principal conductors 46. Thus, the lead connection sections 36 provide individual stripline connectors, with a pair of electrically isolated, coextensive conductors 46 and 50. As discussed above, a few of the vias 24a are electrically connected to the first potential reference element 20, thereby connecting a few of conductors 46 and a few chip contacts 66 to the first potential reference element. Preferably, the first potential reference element and these connected chip contacts and terminals are connected to ground potential and serve as a ground reference for the assembly.

A solder mask layer 76 (FIG. 6) is applied over the top surface of central region 12 and over the top surface of peripheral region 14. The solder mask layer has openings aligned with via liners or terminals 24. A soft, compliant encapsulant such as a gel or an elastomer 78 is provided beneath the solder mask layer, in the spacings surrounding lead connection sections 36. Electrically conductive bonding materials such as solder balls 80 are provided on terminals 24. The rear surface 65 of chip 62, and the corresponding surface of support 68 may be covered by an appropriate metallic thermal spreader 82. The resulting assembly is a completely packaged chip. It may be mounted to a circuit board or other circuit panel by activating bonding material 80, using standard surface mount techniques.

In service, changes in dimensions due to heating and cooling may cause movement of via liners or terminals 24 relative to chip contacts 66, both in horizontal directions parallel to the front face 64 of the chip and in vertical directions towards and away from the chip. Compliant layer 60 and flexible leads 36 and flexible chip carrier or support structure central region 12 allow free movement of the terminals relative to the chip contacts. During such movement, leads 36 flex. The extremely thin metallic conductors 46 and 50 can flex without undergoing substantial fatigue. Therefore, the metallic conductors are substantially resistant to fatigue failures induced by repeated flexure of the leads. The encapsulant 78 further limits the stresses on the leads and enhances fatigue resistance of the assembly.

In operation, as signals are transmitted between terminals 24 and chip contacts 66, the dual-conductor leads provide substantial resistance to crosstalk between signals on adjacent leads. Traces 34 and the first potential plane element or ground plane 20 also provide a dual conductor, stripline lead configuration for transmission of signals along the bottom surface of the chip carrier or central region 12. Because the dual conductor or stripline lead configuration is carried through into leads 36, there is good continuity between each lead and the associated trace; there is a smooth transition with no abrupt change in characteristic impedance per unit length at the juncture of the trace and the lead. All of these factors facilitate operation of the system at high speeds.

Preferably, the first potential reference element 20 on the top surface of central portion 12, the reference conductors 50 on the top surfaces of strips 41 and bus 28 on the top surface of the peripheral region are formed integrally with one another, whereas traces 34 on the bottom surface of the central region, the principal conductors 46 on the bottom surfaces of the strips and bus 30 on the bottom surface of the peripheral region are also integral with one another. Most preferably, the component is fabricated starting with a continuous polymer sheet covered with continuous metallic layers on its top and bottom surfaces. The metallic layers are etched to form the various features, as by applying selective masking layers and photographically patterning the masking layers. The slots 17, holes 54 and gaps 56 in the polymeric layer, as well as the vias in layer 10 which accommodate via liners 24 may be formed by laser ablating and/or chemically etching the polymeric layer. During the formation process, the metallic elements may serve as masks in etching or ablation of the polymeric layer. The top and bottom metallic layers, and hence the potential plane elements, conductors and traces may be formed from metals such as copper or other copper-based alloys, most preferably beryllium copper. Each metal layer may also include one or more additional layers or coatings of metals such as gold, platinum or the like. The sublayers may be about 0.2 to about 2.0 microns thick. These protect the underlying metals from oxidation and corrosion. Via liners 24 and projections 52 may be formed from copper, nickel, gold or other suitable materials. The via liners and projections preferably are deposited by conventional plating processes. The bottom surfaces of projections 52 preferably are covered with a layer of gold or other suitable material forming a metallurgical bond with the chip contact 66.

A component according to a further embodiment of the invention has leads 136 (FIG. 7) similar to the leads of the component illustrated in FIGS. 1–6. Thus, each lead includes a polymeric strip 141 with a reference conductor or top metal layer 150 overlying the top surface of the strip and with a principal conductor or bottom metal layer 148 overlying the bottom surface of the strip. Again, the first end 138 of each lead is permanently connected to a dielectric sheet or support structure 110, whereas the second end 140 of each lead is releasably attached to the dielectric sheet or support structure by a frangible element 158 constituted by a small portion of the top metal layer bridging from the second end of the lead to the support structure. In this embodiment, however, the leads are arranged in a "area array" or grid extending over substantially the entire surface of the support member. Each lead extends across an individual gap or hole 117 in the support structure. Terminals or vias 124 are also arranged in an area array extending over substantially the entire surface of the support structure, so that the terminals are interspersed with the leads and holes. The principal conductor 148 of each lead is connected to the bottom end of a neighboring via 124 by a short trace 134 extending along the bottom surface of the support structure. The top surface of the support structure is substantially covered by a first potential reference element 120 on the top surface of the support structure, the potential reference element 120 being integral with the reference conductors 150 on the top surfaces of the leads. Vias 124 extend through the dielectric support layer 110 and also extend through holes in the potential reference element 120 on the top surface. Thus, vias 124 and the associated principal conductors 148 and traces 134 on the bottom surface are electrically isolated from the first potential reference element on the top surface. However, a few vias 124a are connected to the first potential reference element by bridges 126 similar to those discussed above.

The component depicted in FIGS. 7 and 8 may be utilized in substantially the same manner as the component discussed above with reference to FIGS. 1–6, but with a chip having contacts distributed in an area array covering the chip front surface. Once again, the component is positioned over the contact-bearing front surface of the chip and supported above the front surface of the chip by a compliant layer (not shown) having apertures aligned with holes 117. A tool, similar to the tool discussed above with reference to FIG. 4, may be engaged with the hole 154 in the top of each lead so as to force each lead downwardly and engage the projection 152 with the contact on the lead.

Figure 9:
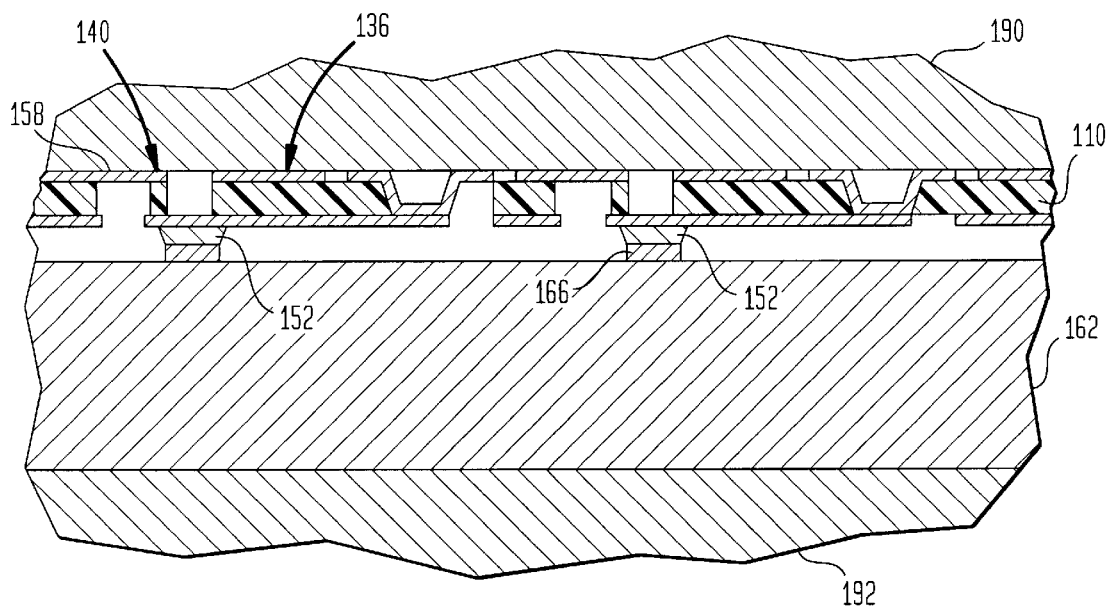
FIG. 9 is a view similar to FIG. 8 but depicting the component in conjunction with a chip during a later stage of manufacture.
Figure 10:
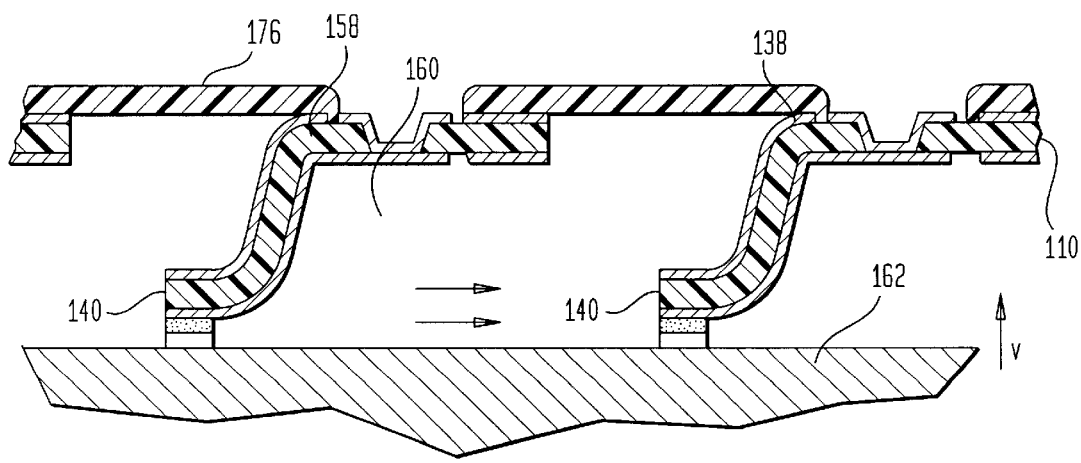
FIG. 10 is a view similar to FIG. 9 but depicting the component and chip at a later stage in manufacture.
Figure 11A:
FIGS. 11A through 11H are fragmentary views depicting portions of the component of FIGS. 7–10 during successive stages of its manufacture.

The components discussed above may also be used in a bonding procedure as depicted in FIGS. 9 and 10. The component, depicted in FIGS. 7 and 8, including the support structure 110 with the leads thereon is aligned with the microelectronic element 162. The component and microelectronic element are disposed between a pair of opposed platelike tools 190 and 192 and are forced together under heat and pressure so as to ond the projections 152 on the bottom surfaces of the leads to the contacts 66 of the chip. During this bonding procedure, the tip or second ends 140 of leads 136 are retained in position on the dielectric support layer 110 by the frangible elements 158. After bonding, a solder mask layer 176 (FIG. 10) is applied over the top surface of the component, thereby closing the holes 117 (FIG. 7) in the dielectric support layer. The component and the microelectronic element 162 having moved relative to one another with a component of motion in a vertical direction V such that the support structure 110 of the connection component moves upwardly away from microelectronic element 162. The tip or second ends 140 of the leads thus move downwardly relative to the terminal or first ends 138 of the leads, thereby bending the leads into a vertically extensive, generally S-shaped configuration. A flowable, liquid compliant material 160 is injected between the dielectric layer 110 of the connection component and the front surface of chip 162, and cured to form a soft, compliant layer in place between the dielectric layer and the chip front surface. The bonding, moving and injecting procedures, can be substantially in accordance with the aforementioned U.S. Pat. No. 5,518,964. The step of moving the dielectric layer and chip relative to one another may be performed in whole or in part by injecting a fluid under pressure between the dielectric layer and the microelectronic element or chip. The fluid injected under pressure may be the flowable liquid encapsulant 160, or else may be a gas which is subsequently replaced by the flowable liquid. As further disclosed in the '518 patent, the vertical movement of the dielectric layer and the microelectronic element may be accompanied by relative movement in a horizontal direction, so as to move the second or tip end 140 of each lead towards the first or terminal end 138 of the lead thereby facilitating bending of the leads into an S-shaped. Alternatively, the vertical movement may be accomplished without the relative horizontal movement of the dielectric sheet 110 and microelectronic element or chip 162. Thus, as taught in U.S. Pat. No. 5,518,964, the leads may be curved in the horizontal plane in the component as manufactured. This facilitates vertical movement. In other arrangements, leads with polymeric strips and with metallic conductors overlying the polymeric strips in accordance with the present invention may be fabricated in the physical configurations described in U.S. Patent provisional patent application No. 60/003,619 filed Sep. 12, 1995 and assigned to the same assignee as the present application, the disclosure of which is hereby incorporated by reference herein, or as described in the non-provisional patent application claiming benefit of said provisional application entitled Lead Configurations, filed Sep. 12, 1996 and naming Thomas DiStefano and John W. Smith as inventors, which application is also assigned to the present assignee and which application is also incorporated by reference herein. Further, leads in accordance with the present invention may be fabricated in the configuration taught in the commonly assigned United States provisional patent application of Thomas DiStefano entitled, Curved Lead Configurations filed Sep. 12, 1996, the disclosure of which is also incorporated by reference herein.

If the component is to be used in the assembly method of FIGS. 9 and 10, the projections 152 on the tip or second ends of the leads are provided with bonding materials suitable for activation by heat or pressure as taught in the aforementioned '964 patent. Among the suitable bonding materials which can be used are eutectic bonding materials. For example, where the leads or the chip contacts include gold, the bonding material may include a metal selected to form a low melting eutectic with gold, such as a metal selected from the group consisting of tin or germanium and combinations thereof. Other suitable bonding materials include diffusion bonding materials adapted to form a bond between the conductive metal layer or principal conductor and the contacts on the chip without formation of a liquid phase; solder; or metal bearing polymeric compositions. Alternatively, each of the lead tip ends may be bonded to the associated chip contacts by engaging the lead with a tool as discussed above with reference to FIGS. 1–8, without bending the leads downwardly. After bonding, the dielectric layer 110 can be moved away from the microelectronic element 162 so as to bend the leads downwardly and break the frangible section 158 in the manner described above with reference to FIGS. 9 and 10.

As further disclosed in the '964 patent, a single connection component can be bonded to the front or contact bearing surface of an entire wafer containing numerous chips, or else can be bonded to an assemblage of several individual chips or other microelectronic elements. Also, the connection component can include additional leads or traces (not shown) extending on the surfaces of dielectric support structure 110 or within such structure so as to interconnect plural chips or microelectronic elements.

Figure 12A:
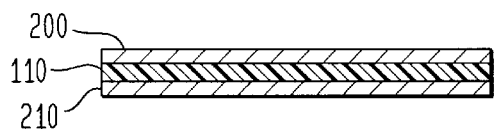
FIGS. 12A through 12H are diagrammatic sectional views of the components depicted in FIGS. 11A through 11H respectively.
Figure 12B:
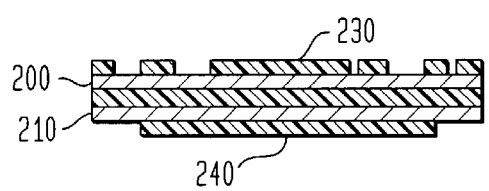
Figure 11B:
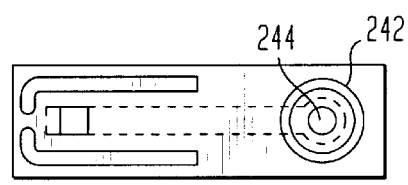
Figure 12C:
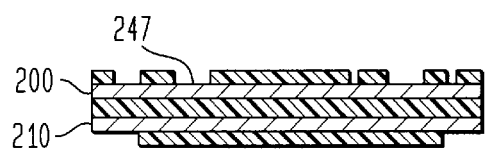
Figure 11C:
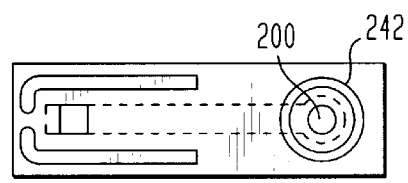
Figure 12D:
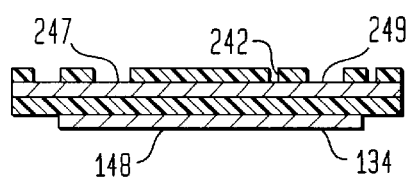
Figure 11D:
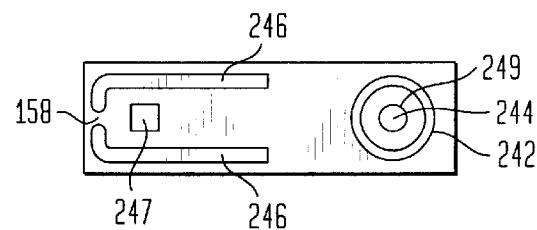
Figure 12E:
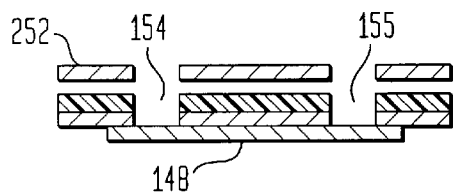
Figure 11E:
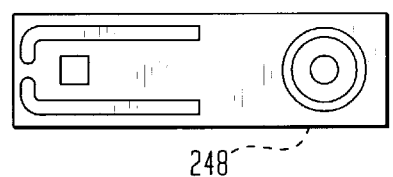
Figure 12F:
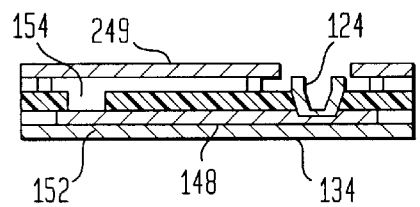
Figure 11F:
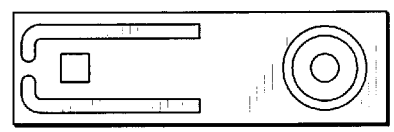
Figure 12G:
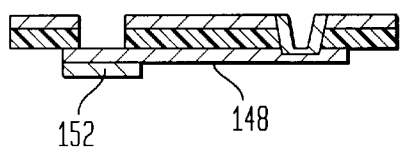
Figure 11G:
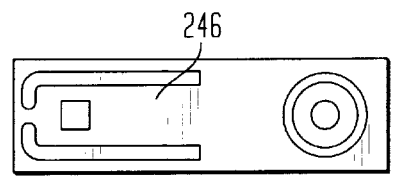
Figure 12H:
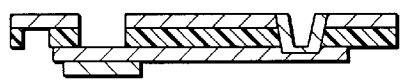
Figure 11H:
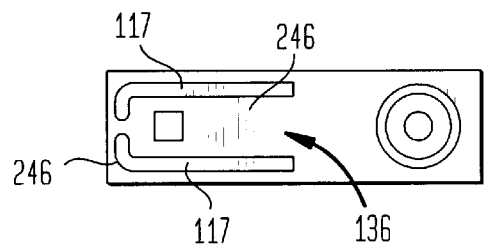

As shown in FIGS. 11A–11H and 12A–12H, a process for making the component of FIGS. 7–10 begins with a dielectric layer 110 having continuous layers 200 and 210 of metals as discussed above on its top and bottom surfaces respectively. Photoresists 230 and 240 are applied on the top and bottom metal layers 200 and 210 and photographically patterned as shown in FIGS. 11B and 12B. The top and bottom layers are then etched as illustrated in FIGS. 11C and 12C. The photoresists are removed leaving the dielectric layer 110 with the patterned metal layers behind as illustrated in FIGS. 11D and 12D. This procedure forms holes 242 and rings 244 in the top metal layer. Rings 244 will ultimately form the top portions of via liners 124. The same processes also produce openings 246 in the top layer on the opposite sides of each area which is to form a lead. Openings 246 define a narrowed, bridge region which will constitute the frangible element 158. The masking and etching process also forms a hole 247 in the top metal layer adjacent the tip of each area which is to form the lead and a further hole 249 in the center of each ring 244. The resist pattering on the bottom layer and the etching of the bottom layer also forms the individual strips or principal conductors 148 on the bottom surface of the dielectric layer as well as the traces 134, constituting extensions of strips 148. Each trace 134 extends to beneath one hole 249 within a ring 244. Using a laser and a mask 252 formed from molybdenum or another material resistant to laser radiation, holes 154 and 155 are formed in layer 110 from the top surface, through the holes 247 and 249 in the top metal layer. During this process, the top metal layer also serves as a mask and precisely limits the location of holes 154 and 155. A further photoresist is then applied, leaving openings only in alignment with holes 249, and the conductive via liners 124 are formed in these holes, so that each via liner is metallurgically bonded to a trace 134. The via liners may be formed by conventional electroplating methods or other suitable deposition methods (FIGS. 11F and 12F). Using a further photoresist on the bottom surface, projections 152 are formed by plating the electrically conductive bonding material on to the tip regions of leads 148 (FIGS. 11G and 12G). After removing the photoresists, the dielectric layer is further ablated using a laser within openings 246 of the top layer, thereby forming holes 117 defining the elongated strip of dielectric material constituting the structural element of each lead 136.

Figure 14:
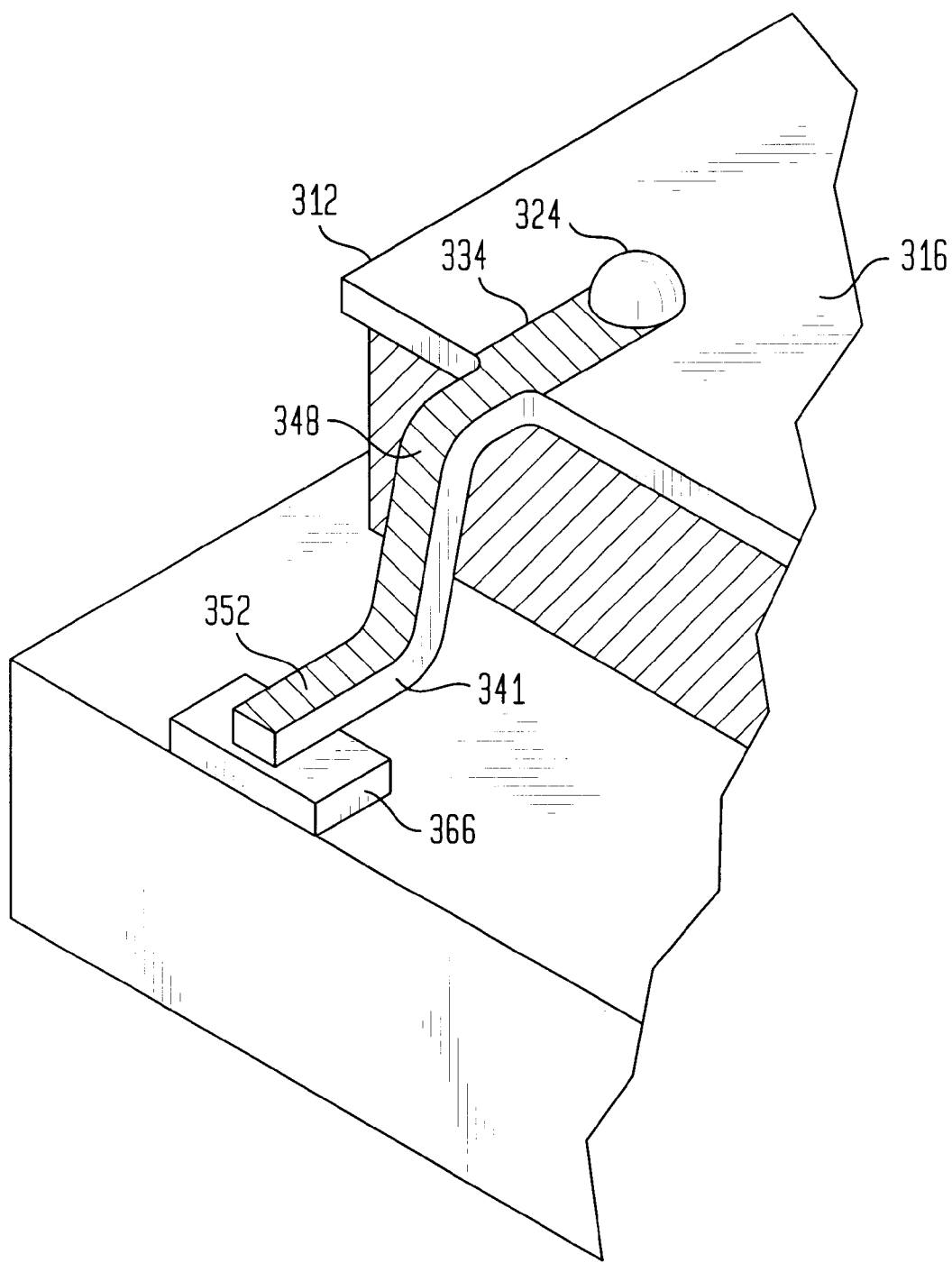
FIG. 14 is a fragmentary, diagrammatic perspective view depicting the assembly made with the component of FIG. 13A–13B.

A component in accordance with a further embodiment of the invention (FIGS. 13A–13C and FIG. 14) has only one conductor 348 on the top surface of the polymeric strip 341. A conductive metal protrusion or bump 352 extends downwardly from conductor 348 through a hole in the polymeric dielectric layer 341 at the bond region of the lead. The frangible region 358 has a narrower width than the adjacent portion of the lead, but includes both the metallic layer or conductor 348 and the polymeric layer 341. In this arrangement, the lead does not have a hole extending into its top surface. When the lead is used, it is engaged by a bonding tool as taught in U.S. Pat. No. 5,390,844. Thermal and ultrasonic energy can be applied through the top surface of metallic layer 348 and transmitted through the metallic projection 352 to a contact on the chip. The leads illustrated in FIGS. 13A–13C and in FIG. 14 are connected to a central region 312 and a peripheral region 314 of the dielectric support structure and may be arranged generally as discussed above with reference to FIGS. 1–6 . Here again, each lead may be forced downwardly by the bonding tool, so that the frangible sections 358 of the individual leads are broken.

As best seen in FIG. 14, the single conductor or metallic layer 348 on the top surface of polymeric strip 341 is continuous with a trace 334 extending along the top surface of the dielectric layer in the central region or chip carrier 312. After bonding, the lead has the configuration as illustrated in FIG. 14, with projection 352 being bonded to the contact 366 of the chip. The lead and the associated trace 334 thus make connection to a terminal 324 on the top surface of central portion 316. Connection components and assemblies in accordance with this embodiment of the invention do not provide the potential reference conductor on the flexible leads and hence do not provide the enhanced electrical characteristics associated with such reference conductors. However, components in accordance with this embodiment of the invention do provide the enhanced flexibility and fatigue resistance afforded by the use of a polymeric strip lead with only a thin metallic conductor layer. As illustrated in FIG. 13D, leads in accordance with this general arrangement may be provided with a frangible section 358' having an interruption in the polymeric layer 341' so that the frangible section 358' bridged solely by a narrow section of the metallic layer 348'.

A lead in accordance with a reverse arrangement is depicted in FIG. 15a–15c. This lead incorporates a polymeric layer 441 having top and bottom surfaces and a single metallic layer or conductor 448 on the bottom surface of strip 441. Here again, the frangible section 458 is constituted by a narrowed region of the lead, with both the polymeric and metal layers. A small projection of a bondable material 452 extends downwardly from the bottom metallic layer 448. This lead also has only a single, principal conductor constituted by layer 448. In the connection component, the conductor or layer 448 is continuous with a trace (not shown) on the bottom surface of the support structure. Each such trace may be connected to a terminal on the bottom surface of the support structure or else may be connected to a terminal on the top surface of the support structure by a via arrangement similar to those discussed above. The lead depicted in FIG. 15b is similar except that this lead has a frangible section 458' in which the polymeric layer 441 is removed and also has a hole 454 in the bond region of the lead in registration with the projection 452' for engagement by a bonding tool as discussed above with reference to FIG. 4.

As will be readily appreciated, numerous variations and combinations of the features discussed above can be utilized without departing from the present invention as defined by the claims. Merely by way of example, the aforementioned Patents and PCT publication disclose numerous arrangements and patterns of leads. Any of these patterns can be made in accordance with the teachings of the present invention. For example, FIGS. 1–6 illustrates a structure in which the leads and traces "fanin" or extend inwardly from contacts at the periphery of the chip to terminals overlying the central region of the chip. However, the invention can be applied to a "fan-out" structure in which the leads extend outwardly beyond the periphery of the chip or to a "fan-in-fan-out" structure which has some leads and traces extending inwardly to terminals on a central region of the support structure and also has other leads and traces extending outwardly to terminals on the peripheral region of the support structure. Indeed, the features of the present invention can be applied to essentially any microelectronic connection component which incorporates a flexible lead structure. Numerous fabrication methods can be used to make the structures discussed above, in addition to the specific fabrication methods described herein. As these and other variations and combinations of the features described above can be utilized without departing from the present invention, the foregoing description of the preferred embodiments should be taken by way of illustration rather than by way of limitation of the invention as defined by the claims.

What is claimed is:

1. A microelectronic connection component comprising:
   (a) a dielectric support structure having terminals thereon;
   (b) a plurality of individual flexible leads attached to said dielectric support structure, said plurality of individual flexible leads being separate and spaced from one another so that the end of each lead remote from the dielectric support structure is movable with respect to the support structure independently of movement of the end of the other flexible leads, said individual leads projecting from said dielectric support structure, each of said plurality of individual flexible leads including a flexible dielectric member, a principal conductor connected to at least one of said terminals and a reference conductor extending codirectionally along the dielectric member.

2. A component as claimed in claim 1 wherein each said flexible dielectric member is a dielectric strip having top and bottom surfaces, the principal conductor of each said lead overlies the one said surface of the strip in such lead and the reference conductor overlies the opposite surface of the strip in such lead.

3. A component as claimed in claim 2 wherein said dielectric support structure has top and bottom surfaces and wherein said terminals are disposed on one said surface of said substrate.

4. A component as claimed in claim 3 wherein said top and bottom surfaces of said strips are continuous with the top and bottom surfaces of said support structure, respectively.

5. A component as claimed in claim 4 wherein said strips and said support structure are formed integrally with one another.

6. A component as claimed in claim 5 wherein said strips and said support structure have the same thickness.

7. A component as claimed in claim 3 further comprising a conductive first potential reference element overlying one said surface of said support structure, said reference conductors of at least some of said leads being electrically connected to said potential reference element.

8. A component as claimed in claim 7 wherein said first potential reference element overlies said top surface of said support structure and said first potential reference element holes in it, said terminals being disposed on said top surface of said support structure in said holes, at least some of said terminals being electrically isolated from said first potential reference element, said reference conductors of said leads overlying said top surfaces of said strips and being continuous with said first potential reference element, said principal conductors of said leads being disposed on the bottom surfaces of said strips.

9. A component as claimed in claim 8 further comprising electrically conductive vias extending from at least some of said terminals to the bottom surface of said support structure, the principal conductors of at least some of said leads being connected to said vias.

10. A component as claimed in claim 9 further comprising electrically conductive traces extending along the bottom surface of said support structure and electrically connecting at least some of said vias to at least some of said principal conductors.

11. A component as claimed in claim 10 wherein at least some of said principal conductors are continuous with said traces.

12. A component as claimed in claim 7 wherein at least one of said terminals is electrically connected to said first potential reference element.

13. A component as claimed in claim 12 wherein the principal conductor of at least one of said leads is electrically connected to said first potential reference element.

14. A component as claimed in claim 13 further comprising a second potential reference element overlying the side of said support structure opposite from the first potential reference element and electrically isolated from said first potential reference element, at least one of said terminals and the principal conductor of at least one of said leads being electrically connected to said second potential reference element.

15. A component as claimed in claim 3 wherein said conductors are formed from metal about 10 microns thick or less.

16. A component as claimed in claim 15 wherein said conductors are formed from metal about 5 microns thick or less.

17. A component as claimed in claim 16 wherein said metal is between about 2 microns and about 5 microns thick.

18. A component as claimed in claim 15 wherein said metal is selected from the group consisting of copper and copper alloys.

19. An assembly comprising a component as claimed in claim 2 or claim 3 or claim 8 or claim 15 or claim 19 or claim 21 further comprising a microelectronic element having a front surface facing the bottom surface of said support structure and said strips and having contacts on said front surface, said principal conductors of said leads being connected to said contacts, said reference conductors of said leads extending to the vicinity of said contacts connected to the principal conductor of the same lead.

20. A microelectronic connection component comprising:
   (a) a dielectric support structure having oppositely-directed top and bottom surfaces;
   (b) a plurality of individual flexible leads attached to said dielectric support structure, each of said plurality of individual leads being separate and spaced from one another, said individual leads projecting from said dielectric support structure, each of said plurality of flexible individual leads including a flexible dielectric strip having top and bottom surfaces, a principal conductor disposed on one surface of the strip and a reference conductor disposed on the opposite surface of the strip, said dielectric strip, said principal conductor and said reference conductor of each said plurality of individual leads being displaceable independently of the displacement of said dielectric strips, said principal conductors and said reference conductors of the other of said plurality of individual leads.

21. A component as claimed in claim 20 wherein said strips and said support structure are formed integrally with one another as parts of a common flexible dielectric sheet.

22. A component as claimed in claim 20 further comprising a first potential reference element electrically connected to at least some of said reference conductors overlying one surface of said support structure.

23. A component as claimed in claim 20 further comprising terminals on a surface of said support structure electrically connected to at least some of said principal conductors.

24. An assembly as claimed in claim 19 wherein said microelectronic element is a semiconductor chip.

25. A microelectronic connection component comprising:
   (a) a dielectric support structure defining a gap;
   (b) one or more leads extending across said gap, each said lead including a connection section having a first end attached to said support structure on one side of said gap and a second end, each said lead further including a frangible section within said gap, the second end of the connection section being attached to the support structure on the other side of said gap through such frangible section, the connection section of each said lead including a flexible polymeric layer extending to the second end of said connection section adjacent said frangible section and one or more metallic layers overlying said polymeric layer, the frangible section being devoid of said polymeric layer but including one or more of said metallic layers.

26. A component as claimed in claim 25 wherein said one of said metallic layers is about 10 microns or less thick.

27. A component as claimed in claim 26 wherein said metallic layer has a width in said frangible section less than the width of said metallic layer in adjacent portions of said lead.

28. A microelectronic connection component for connection to a microelectronic element having at least one contact, said component comprising a support structure and one or more leads, each said lead projecting from said support structure, each said lead including a connection section having a first end attached to the support structure and having a second end remote from the first end, each said connection section including a polymeric strip having oppositely-directed top and bottom surfaces, a first metallic layer overlying one of said surfaces and a metallic projection extending downwardly from said metallic layer and protruding downwardly from the lead adjacent said second end for bonding to said contact, said projection provided on said metallic layer prior to bonding said projection to said contact on said microelectronic element.

29. A component as claimed in claim 28 wherein each said first metallic layer is disposed on the top surface of the associated strip, each said projection extending through such strip.

30. A component as claimed in claim 29 wherein each said first metallic layer is disposed on the bottom surface of the associated strip.

31. A component as claimed in claim 30 wherein each said strip has a hole extending at least partially through the strip from the top surface thereof in alignment with the projection.

32. A component as claimed in claim 31 wherein each said lead further includes a second metallic layer overlying the strip on the top side of the strip, said second metallic layer extending to the second end of the lead and having a hole in alignment with the hole in the strip and in alignment with the projection of such lead.

33. A microelectronic connection component comprising a support structure and one or more leads, each said lead including a connection section having a first end attached to the support structure and having a second end remote from the first end, each said connection section including a polymeric strip having oppositely-directed top and bottom surfaces, a first metallic layer overlying the bottom surface of the strip, a second metallic layer overlying the top surface of said strip, both of said metallic layers and said strip extending to a bond region of the lead adjacent the second end thereof, said second metallic layer and said strip having holes aligned with one another in said bond region, said first metallic layer extending over said hole with said strip.

34. A microelectronic connection component comprising a support structure and one or more leads, each said lead including a connection section having a first end attached to the support structure and having a second end remote from the first end, each said connection section including a polymeric strip having oppositely-directed top and bottom surfaces, a first metallic layer overlying the bottom surface of the strip, said first metallic layer and said strip extending to a bond region of the lead adjacent the second end thereof, each said strip having a hole extending from said top surface towards said first metallic layer at least partially through said polymeric layer in alignment with said bond region.

35. A method of bonding a connection component as claimed in claim 31 or claim 32 or claim 33 or claim 34 to a microelectronic element having contacts thereon comprising juxtaposing the second ends of the leads with the contacts of the component and bonding the leads to the contacts by inserting a bonding tool into the holes of said leads so that the bonding tool engages the first metallic layer and applying energy through the bonding tool to the first metallic layer.

36. A microelectronic connection component comprising:
 (a) a support structure defining a gap;
 (b) one or more leads extending across said gap, each said lead including a connection section having a first end attached to said support structure on one side of said gap and a second end, each said lead further including a frangible section, the second end of the connection section being attached to the support structure through such frangible section, the connection section of each said lead including a flexible polymeric layer extending to the second end of said connection section and one or more metallic layers overlying said polymeric layer, the frangible section being devoid of said polymeric layer but including one or more of said metallic layers, wherein said one or more metallic layers include two metallic layers disposed on opposite surfaces of said polymeric layer, said frangible section including only one of said metallic layers.

* * * * *

UNITED STATES PATENT AND TRADEMARK OFFICE
CERTIFICATE OF CORRECTION

PATENT NO.     : 6,329,607 B1
DATED          : December 11, 2001
INVENTOR(S)    : Joseph Fjelstad and John W. Smith It is certified that error appears in the above-identified patent and that said Letters Patent is hereby corrected as shown below:

Column 4,
Line 21, "of" should read -- or --.

Column 6,
Line 63, "FIG." should read -- FIGS. --.

Column 7,
Line 36, "6" should read -- 5 --.

Column 8,
Line 59, "78" should read -- 74 --.

Column 9,
Line 35, "6" should read -- 2 --.

Column 11,
Line 4, "a" should read -- an --.
Line 46, "ond" should read -- bond --.

Column 14,
Line 21, after "358'" insert -- is --.
Line 24, "FIG." should read -- FIGS. --.
Line 52, "illustrates" should read -- illustrate --.
Line 53, "fanin" should read -- fan-in- --.

Column 15,
Line 47, before "holes" insert -- has --.

UNITED STATES PATENT AND TRADEMARK OFFICE
CERTIFICATE OF CORRECTION

PATENT NO. : 6,329,607 B1
DATED : December 11, 2001
INVENTOR(S) : Joseph Fjelstad and John W. Smith It is certified that error appears in the above-identified patent and that said Letters Patent is hereby corrected as shown below:

<u>Column 16,</u>
Line 26, "19" should read -- 20 --.

Signed and Sealed this

Thirtieth Day of April, 2002

Attest:

Attesting Officer

JAMES E. ROGAN
*Director of the United States Patent and Trademark Office*